United States Patent
Knickerbocker et al.

(10) Patent No.: US 11,268,867 B2
(45) Date of Patent: Mar. 8, 2022

(54) STRAIN GAUGE STRUCTURE FOR A SENSOR

(71) Applicant: INTERNATIONAL BUSINESS MACHINES CORPORATION, Armonk, NY (US)

(72) Inventors: John U. Knickerbocker, Yorktown Heights, NY (US); Minhua Lu, Mohegan Lake, NY (US); Katsuyuki Sakuma, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1093 days.

(21) Appl. No.: 15/844,694

(22) Filed: Dec. 18, 2017

(65) Prior Publication Data

US 2019/0187010 A1    Jun. 20, 2019

(51) Int. Cl.
*H01L 41/047* (2006.01)
*H01L 41/113* (2006.01)
*G01L 1/22* (2006.01)
*G01L 19/00* (2006.01)
*G01L 9/06* (2006.01)
(Continued)

(52) U.S. Cl.
CPC .............. *G01L 1/2293* (2013.01); *G01L 1/16* (2013.01); *G01L 1/18* (2013.01); *G01L 1/2206* (2013.01); *G01L 9/06* (2013.01); *G01L 19/0092* (2013.01); *H01L 41/047* (2013.01); *H01L 41/1132* (2013.01)

(58) Field of Classification Search
CPC .................................. G01L 1/16; G01L 1/18
USPC ......................................................... 310/317
See application file for complete search history.

(56) References Cited

U.S. PATENT DOCUMENTS

| 6,216,545 B1 | 4/2001 | Taylor |
| 6,360,615 B1 | 3/2002 | Smela |
| 2010/0010379 A1 | 1/2010 | De Rossi et al. |

(Continued)

OTHER PUBLICATIONS

De Rossi et al., "Dressware: Wearable Piezo-and Thermoresisitive Fabrics for Ergonomics and Rehabilitation," Proceedings—19th International Conference—IEEE/EMBS, Oct. 30-Nov. 2, 1997, Chicago, IL, USA, Copyright 1997 IEEE, pp. 1880-1883.
(Continued)

*Primary Examiner* — Derek J Rosenau
(74) *Attorney, Agent, or Firm* — Douglas M. Crockatt (57) ABSTRACT

According to an embodiment of the present invention, a structure for a strain gauge device is provided. The structure comprises a layer of strain gauge material and one or more contact pads positioned directly on the layer of strain gauge material. The structure further comprises a multiplexer, measuring device, amplifier, analog to digital converter, microcontroller, and wireless adapter. According to the structure, the multiplexer selects a given contact pad pair of the one or more contact pad pairs, the measuring device measures signal generated by the layer of strain gauge material between the given contact pad pair, the amplifier amplifies the measured signal, the analog to digital converter converts the amplified analog signal to a digital signal, the microcontroller processes the digital signal, and the wireless adapter transmits the processed digital signal. In addition, the structure may further comprise a battery to provide energy to the structure.

18 Claims, 10 Drawing Sheets

(51) Int. Cl.
    *G01L 1/18*           (2006.01)
    *G01L 1/16*           (2006.01)

(56) References Cited

U.S. PATENT DOCUMENTS

| | | |
|---|---|---|
| 2014/0238153 A1 | 8/2014 | Wood et al. |
| 2015/0335288 A1* | 11/2015 | Toth .................... A61B 5/6833 600/373 |
| 2015/0340630 A1 | 11/2015 | Im et al. |
| 2016/0179276 A1* | 6/2016 | Nathan ................ G06F 3/0445 345/174 |
| 2016/0202755 A1 | 7/2016 | Connor |
| 2016/0278651 A1 | 9/2016 | Lu et al. |
| 2016/0290880 A1 | 10/2016 | Lewis et al. |
| 2020/0105125 A1* | 4/2020 | Haas ................... H04L 25/4902 |

OTHER PUBLICATIONS

Neuman, "Thin-Film Microelectronic Wearable Body Sensors," Published in: Engineering in Medicine and Biology Society (EMBC), 2015 37th Annual International Conference of the IEEE, IEEE Xplore: Nov. 5, 2015, Date of Conference: Aug. 25-29, 2015, Milan, Italy, 978-1-4244-9270-1/15, ©2015 IEEE, pp. 7546-7549.

Ramadan et al., "A review of piezoelectric polymers as functional materials for electromechanical transducers," Abstract, Published Jan. 17, 2014, Copyright IOP Publishing Ltd., http://iopscience.iop.org/article/10.1088/0964-1726/23/3/033001/meta, pp. 1-3.

* cited by examiner

STRAIN GAUGE STRUCTURE FOR A SENSOR

BACKGROUND

The present invention relates generally to strain gauges, and more particularly to a strain gauge structure for a device.

A strain gauge is a device that measures a strain on an object. The strain is commonly measured in electrical resistance by piezoresistive type strain gauges or measured in electrical potential by piezoelectric type strain gauges. In any case, however, strain gauges measure a strain due to deformation of the strain gauge caused by stress, force, and movement on an object on which the strain gauge is attached. In piezoresistive strain gauges, mechanical strain is sensed as a change in electrical resistance while in piezoelectric strain gauges, mechanical strain is sensed by a voltage potential. Strain gauges are used widely, along with many other devices such as accelerometers, gyroscopes, temperature, and pressure sensors, to detect motion and strain. They may be attached to the human body on fingernails, arteries, and joints to measure strain, pulse, blood pressure, and fine movement of fingers, toes and limbs.

SUMMARY

According to an embodiment of the present invention, a structure for a strain gauge device is provided. The structure comprises a layer of piezoelectric material, three or more contact pads positioned directly on the layer of piezoelectric material in a non-linear configuration, and wherein the layer of piezoelectric material and the three or more contact pads are operatively connected to a multiplexer, a measuring device, an amplifier, an analog to digital converter, a microcontroller, and a wireless adapter.

More specifically, the structure is operatively connected such that the multiplexer selects two or more pairs of the three or more contact pads, the measuring device measures an analog signal corresponding to the layer of piezoelectric material between two or more pairs of contact pads, the amplifier amplifies the analog signal, the analog to digital converter converts the amplified signal to a digital signal, the microcontroller processes the digital signal, and the wireless adapter transmits the processed digital signal. In some embodiments, the structure of further comprises an energy source to provide energy to the structure.

In some embodiments, the structure comprises a first pair of the two or more pairs of contact pads that measure a first signal produced by the piezoelectric material in a first direction, and a second pair of the two or more pairs of contact pads that measure a second signal produced by the piezoelectric material in a second direction, thereby forming a two-dimensional strain field based on the measured signals and coordinates of the contact pads.

Moreover, according to the structure, a third signal in a third direction can be inferred from the first signal in the first direction and the second signal in the second direction. Similarly, a malfunctioning contact pad can be identified by comparing the inferred third signal in the third direction to a third signal measured by the third pair of the contact pads in the third direction.

In the structure described herein, a change in the signal corresponding to the layer of piezoelectric material between the two or more pairs of contact pads is indicative of a change in strain corresponding to the layer of piezoelectric material between the two or more pairs of contact pads.

Additionally provided is another structure for a strain gauge device. This other structure comprises a layer of piezoresistive material, three or more contact pads positioned directly on the layer of piezoresistive material in a non-linear configuration, and wherein the layer of piezoresistive material and the three or more contact pads are operatively connected to a multiplexer, a measuring device, an amplifier, an analog to digital converter, a microcontroller, and a wireless adapter.

More specifically, this other structure is operatively coupled such that the multiplexer selects two or more pairs of the three or more contact pads, the measuring device measures an analog signal corresponding to the layer of piezoresistive material between two or more pairs of contact pads, the amplifier amplifies the analog signal, the analog to digital converter converts the amplified signal to a digital signal, the microcontroller processes the digital signal, and the wireless adapter transmits the processed digital signal. In some embodiments, the structure further comprises an energy source to provide energy to the structure. In some embodiments, the measuring device is a Wheatstone bridge or four point Kevin probe.

The structure may further prescribe that a first pair of the two or more pairs of contact pads measure a first signal produced by the piezoresistive material in a first direction, and that a second pair of the two or more pairs of contact pads measure a second signal produced by the piezoresistive material in a second direction, thereby forming a two-dimensional strain field based on the measured signals coordinates of the three or more contact pads. In addition, a third signal in a third direction can be inferred from the first signal in the first direction and the second signal in the second direction. Similarly, in accordance with the structured described herein, a malfunctioning contact pad can be identified by comparing the inferred third signal in the third direction to a third signal measured by the third pair of the contact pad in the third direction.

According to the structure, a change in the signal corresponding to the layer of piezoresistive material between the two or more pairs of contact pads is indicative of a change in strain corresponding to the layer of piezoresistive material between the two or more pairs of contact pads.

In some embodiments, the layer of piezoresistive semiconductor strain gauge material receives a doping condition such that the first signal is equal to the second signal when the later of piezoresistive material is unstrained.

Also provided is a method for mapping strain on a strain gauge device, wherein the strain gauge device comprises a layer of strain gauge material and two or more pairs of contact pads positioned directly on the layer of strain gauge material in nonlinear configuration, and wherein the method comprises a computer input or mapping three or more locations coordinates corresponding to each of the two or more contact pad pairs, the computer measuring a first signal corresponding to at least two contact pad pairs of the two or more contact pad pairs, and the computer generating a strain field map based on the signal corresponding to the at least two contact pad pairs and the three or more locations coordinates corresponding to each of the three or more contact pads. The method further comprises the computer measuring a second signal corresponding to the at least one contact pad pair of the two or more contact pad pairs and the computer determining a strain change associated with the contact pad pair based on comparing the first signal to the second signal.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

In FIG. 1A, strain gauge device 100A comprises piezoresistive semiconductor type strain gauges and, in FIG. 1B, strain gauge device 100B comprises piezoelectric type strain gauges.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Strain gauge devices measure strain that can be related to stress, force, torque, and a host of other stimuli including displacement, acceleration, and position. Some of the most commonly used types of strain gauges include the foil strain gauge, the piezoresistive semiconductor strain gauge, and piezoelectric strain gauge. The foil strain gauge comprises a metal foil that is photo-etched in a grid pattern on an electric insulator of thin resin, from which gauge leads are attached. The semiconductor strain gauge comprises a piezoresistive type material that senses a change in electrical resistance under stress. Piezoresistive semiconductor strain gauges are often preferred over foil gauges for measurements of small strain. Piezoelectric type strain gauges comprise a piezoelectric type material that generate electrical charge under mechanical stress. Piezoresistive type semiconductor strain gauges typically comprise of a doped silicon (Si), graphene, or germanium (Ge) material while piezoelectric type strain gauges typically comprise lead zirconate titanates (PZTs), potassium niobate, sodium tungstate, barium titanate (BaTiO3), and lead titanate (PbTiO3). The properties of a given strain gauge are denoted by a unit-less constant known as a gauge factor. The gauge factor, of GF, is defined as the fractional change in resistance, ($\Delta R/R$), divided by the fractional change in length, ($\Delta L/L$). The gauge factor of a semiconductor strain gauge is one to two orders of magnitude higher than that of metal foil strain gauges. It will be appreciated by one skilled in the art that the proceeding descriptions of the embodiments described herein are applicable to both piezoresistive and piezoelectric strain gauges with little to no modification necessary, as will be described with greater detail below with reference to FIG. 1A-1B.

Strain gauges and arrays of strain gauges, along with accelerometers, magnetometers, gyroscopes, and temperature sensors, are often times used as sensors to collect data. For example, strain gauge sensors can be attached to everyday items used by humans, such as pens, pencils, cups, utensils, chop sticks, door handles, steering wheels, and the like in order to take measurements using non-invasive tools. Moreover, in combination with wireless communication and battery modules, strain gauges can be used to collect data in obscure areas over long periods of time. For example, strain gauge sensors can be attached to parts of the human body to collect data for various affects, including measuring fine movement of fingers, fingernails, toes, toenails, limbs, etc., and even for measuring a pulse or blood pressure at an artery. However, the current state of the aforementioned devices makes them unsuitable for fine movement measurement that is required by the aforementioned applications of wearable devices. For example, pressure sensors can be used to sense pressure change and stress changes from fine movement, however, they are not sensitive to detect the direction of the movement and don't have location precision to detect fine movement. In general, the design and layout of current strain gauges are fixed for industrial purposes and are not suitable for wearable or healthcare applications.

Figure 1A:
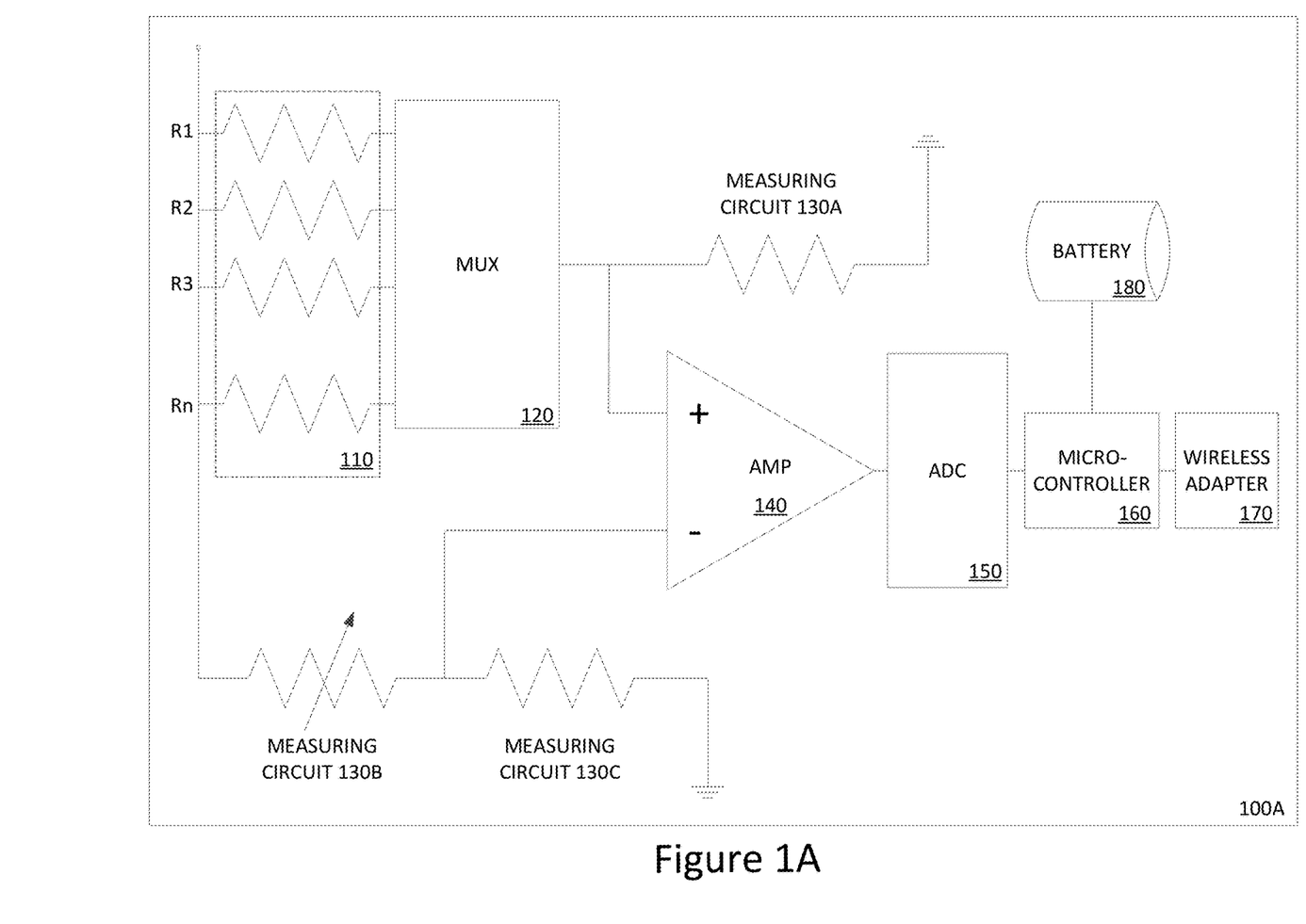
FIGS. 1A-1B depict a strain gauge device 100, in accordance with an embodiment of the present invention.

FIGS. 1A-1B illustrate strain gauge device 100. In the example embodiment depicted by FIG. 1A wherein strain gauge pattern 110 comprises piezoresistive type semiconductor strain gauges, strain gauge device 100A includes strain gauge pattern 110, multiplexer (mux) 120, measuring circuit 130A-C, amplifier (amp) 140, analog to digital converter (ADC) 150, microcontroller 160, wireless adapter 170, and battery 180. Also illustrated by FIG. 1A are resistances R1, R2, R3 . . . Rn corresponding to one or more piezoresistive type semiconductor strain gauges of strain gauge pattern 110.

Figure 1B:
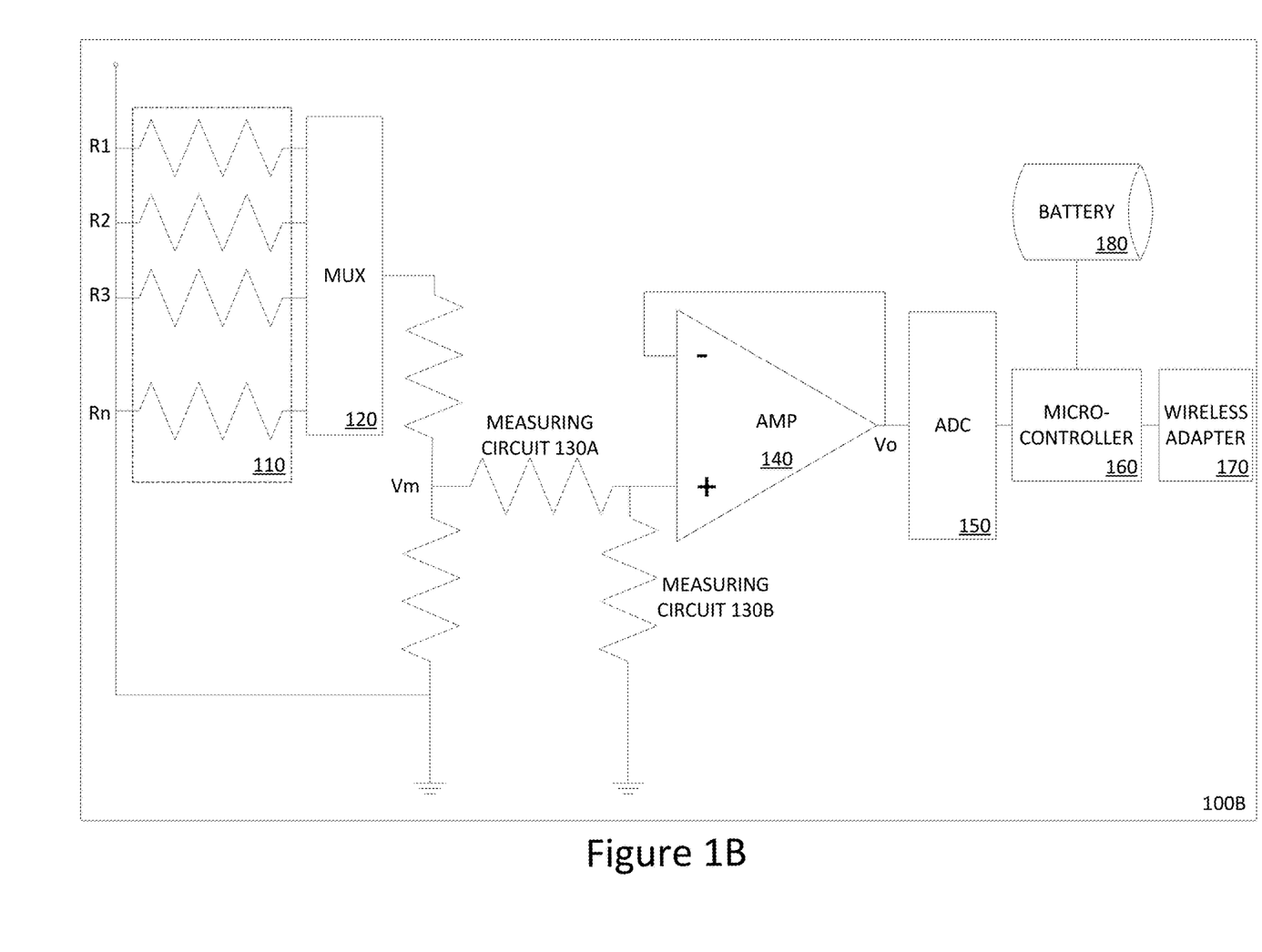

Similarly, FIG. 1B depicts strain gauge device 100B in accordance with an alternative embodiment wherein strain gauge pattern 110 comprises piezoelectric type strain gauge. While strain gauge device 100B similarly comprises many similar components as strain gauge device 100A, i.e. mux 120, measuring circuit 130, amp 140, etc., an important distinction of strain gauge device 100B is that measuring circuit 130A-130B of FIG. 1B comprises a potential measuring circuit. The operations of measuring circuit 130 within each of FIG. 1A and FIG. 1B are described with greater detail below.

In the example embodiment, strain gauge pattern 110 is comprised of two or more strain gauges formed by strategically placing contact pads in a two dimension pattern on a strain gauge material. The contact pads make contact with a surface for which a strain measurement is desired and the strain is sensed by the attached strain gauge material, thereby forming a strain gauge between each contact pad pair. Based on a measurement of strain between possible configurations of the contact pad pairs, together with spatial coordinates of the contact pads, the present invention can deduce a 2-D strain tenser field with location, direction and magnitude information of a strain. In the example embodiment, strain gauge pattern 110 is comprised of piezoresistive material or piezoelectric material such that the strain gauges may be piezoresistor type (FIG. 1A), piezoelectric type (FIG. 1B), or a combination of both. In other embodiments, strain gauge pattern 110 may comprise metal foil strain gauges, a combination of both semiconductor and foil strain gauges, or alternative strain measuring devices. In the example embodiment, contact pads are placed directly on one side or on both sides of the layer of strain gauge material, as illustrated by FIGS. 2K-2L, in order to measure a strain on the layer of strain gauge material between each pair of contact pads. In one embodiment, the two-dimensional pattern of the contact pads can be a two-dimensional array while, in other embodiments, the pattern may be a three-dimensional array. For a more detailed description of strain gauge pattern 110, reference will now be made to FIGS. 2A-2J.

FIGS. 2A-2J depict top-down views of various configurations of strain gauge pattern 110. In the following configurations, contact pads are positioned directly on strain gauge material to form a two dimensional strain gauge pattern 110. In FIGS. 2A-2J, contact pads are depicted by A0, A1, A2 . . . An and resistance (in piezoresistive type strain gauges) or electrical potential (in piezoelectric type strain gauges) are depicted by R1, R2, R3 . . . Rn. Moreover, in all of FIGS. 2A-2J, various two-dimensional-strain tensor fields can be mapped with different combinations of pairs of contact pads A1-An, as will be described below.

Figure 2A:
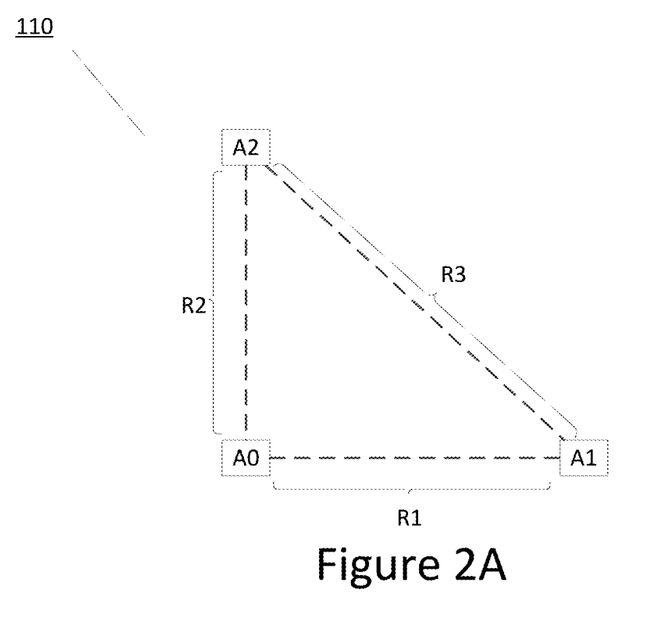
FIGS. 2A-2J depict various configurations of strain gauge pattern 110 of strain gauge device 100, in accordance with an embodiment of the present invention.
Figure 2B:
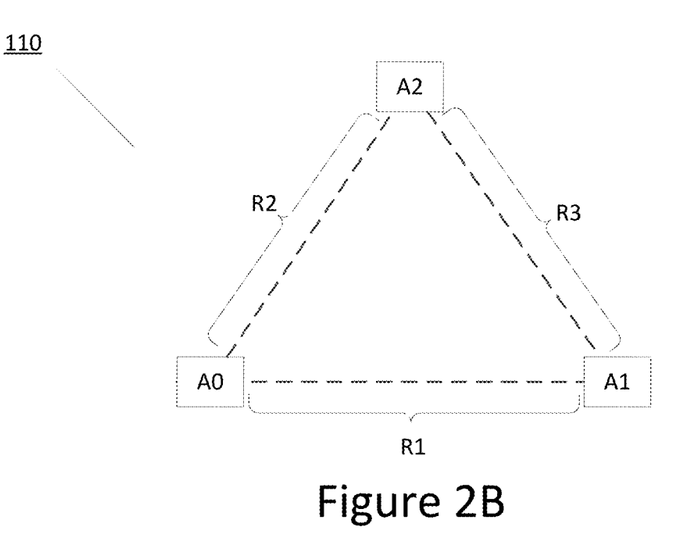

FIGS. 2A-2B illustrate an example of two-dimensional pattern with the least number of contact pads necessary for strain inference is a variety of directions, i.e. three contact pads. The three contact pads can be in any configuration as long as they are not all in a straight line, thereby forming a two-dimensional plane. FIG. 2A shows A1 and A2 are an equal distance from A0, but A0-A1 and A0-A2 form a right angle. The contact pad pair A0-A1 and A0-A2 measures strain change in horizontal R1 and vertical R2 direction, respectively. Contact pair A1-A2 measures strain change in 45 degree direction, R3. If the material properties are known, one can infer the strain R3 from R1 and R2, or R1 from R2 and R3. FIG. 2B is another example of the configuration, where three pads forms equilateral triangle. Contact pads pair A0-A1 measures strain in horizontal direction, contact pads pair A0-A2 and A1-A2 measures strain in 60 degree and 120 degree, respectively. Again, the third strain may be deduced from the other two if the material property is known. When all three strains are measured, the measurement value can be checked by the calculated value so that the defective contact pad can be identified if a large discrepancy is found. Please note that the configuration of three pads can vary depending on the design and measurement needs, as long as they are not in a linear format.

Figure 2C:
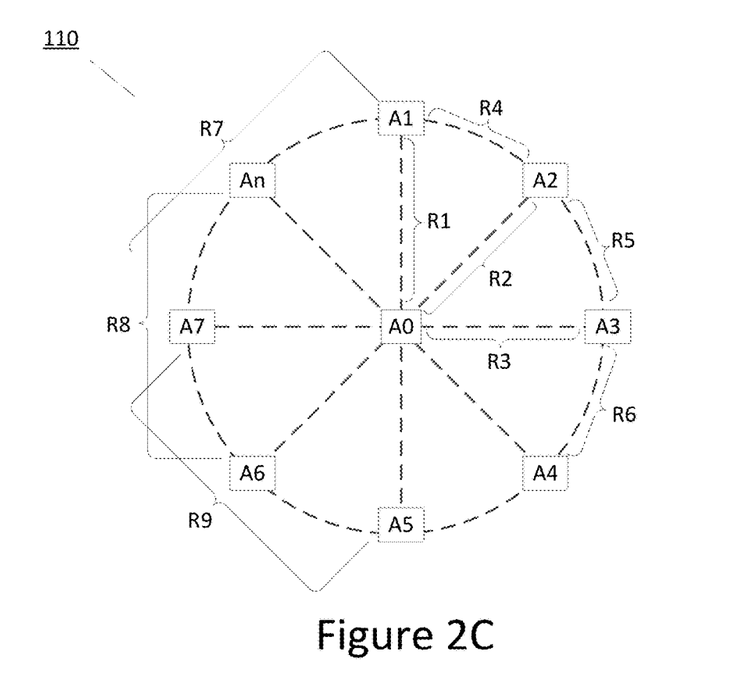

According to one configuration and illustrated by FIG. 2C, contact pads are positioned equidistant from a center pad A0 such that each of outer contact pads A1-An is a same distance from center contact pad A0 (e.g. A0-A1=A0-A2=A0-A3, etc.). In the example embodiment, each combination of outer contact pad A1-An and center contact pad A0 constitute a pair and, because the distance between each contact pad of a pair is equal, as is the electrical resistance/potential sensed by the strain gauge material positioned between each pair (e.g. R1=R2=R3=X ohms/mV). Moreover, contact pads A0-An are positioned such that the one or more strain gauges between each contact pad pair is sensitive to a strain in a particular orientation. With reference to FIG. 2C, contact pad pair A0-A1 sense vertical strain at R1 while contact pad pair A0-A3 sense horizontal strain at R3 and contact pad pair A0-A2 sense forty-five degree strain at R2. By positioning contact pads A0-An of each contact pad pair equidistant from one another, the resistance/potential sensed by the strain gauge between each pair is equal when at rest (when using homogenous strain gauge material). While configuring each contact pad pair such that all pairs have an equal resistance/potential may be advantageous in terms of computing a strain, the present invention includes configurations in which resistance/potential amongst contact pad pairs is not equal, which may be accounted for by microcontroller 160.

In addition to sensing strain in the horizontal, vertical, and forty-five degree directions, strain gauge pattern 110 is further capable of detecting strain in additional directions by sensing strain between any two contact pad pairs. For example and with reference to FIG. 2C, strain gauge pattern 110 is capable of sensing strain R4 between the outer contact pads A1-A2. However, because the distance between each of outer contact pad pairs A1-An (e.g. A1-A2, A2-A3, etc.) are not equidistant to those between the outer contact pads A1-An and inner contact pad A0 (e.g. A0-A1, A0-A2, etc.), modifications might be made to the strain gauge material so that measurements taken by the strain gauge material A1-A2 is equal to A0-A1. In embodiments having piezoresistive type semiconductors, equalizing resistances between contact pad pairs that are differing distances apart, for example R1, R4, and R7 in FIG. 2C, is performed by modifying the doping condition (e.g. patterns, concentration of dopant, etc.) to change electrical properties of the semiconductor material. For example and with reference to FIG. 2C, the semiconductor material between contact pad pair A1-A2, A2-A3, etc. may receive a modified doping condition (e.g. patterns, concentration of dopant, etc.) to change electrical properties in order to exhibit a gauge factor that differs from those of the semiconductor material between contact pad pairs A0-A1, A0-A2, etc. In addition, a channel width and/or depth of the strain gauge material may be modified to reflect a greater or lesser cross-sectional area, thus modifying a resistance along the channel. In a yet further embodiment, a strain gauge material having different electrical resistance or potential properties may be chosen for measuring strain between contact pad pair A1-A2 and between other outer to outer contact pad pairs. Using any or all of these methods, equal resistance/potential can be established between any contact pad pairs of strain gauge pattern 110 despite contact pads of a pair having differing distances apart. Again, however, while equalizing a signal received from each strain gauge is advantageous in terms of computation, it is not necessary to practice the invention herein.

For instance and with reference to FIG. 2C, all strain gauges having similar lengths between contact pad pairs may have similar resistances/potentials, i.e. R1=R2=R3, R4=R5=R6, and R7=R8=R9. However, strain gauges having dissimilar lengths may have differing resistances, i.e. R1 is not equal to R4 and, similarly, R7 may not be equal to R1 or R4. Accordingly, in some cases, strain gauge pattern 110 may comprise a several groups of strain gauges that exhibit similar resistances or potentials depending on the shape of the object on which strain gauge device 100 is applied. In addition to configurations in which groups of contact pad pairs have a same resistance/potential, configurations in which no two pairs have a same resistance/potential are possible. In general, measurements can be taken between any two contact pads of any contact pad pair. In the example embodiment, microcontroller 160 can be configured to scan through each strain gauge between each contact pad pair to measure strain along each pair direction. Note that while R in FIGS. 2A-J represents electrical resistance in the case of piezoresistive type strain gauges, R may also represent electric potential in the case of piezoelectric type strain gauges.

Each contact pad of stain gauge array 110 may be associated with first, second, third, etc. orders of contact pads. For example, first order contact pads of a given contact pad are a group of the nearest contact pads while second order contact pads are a second nearest group of contact pads, and so on. One can extend the definition to a third, fourth, or any number of order contact pads. For instance and with reference to FIG. 2G, the first order contact pads for contact pad A7 are A2, A6, A10, and A8. Here, the first order contact pads measure the strain in two orthogonal directions, vertical and horizontal. Similarly, the second order contact pads for contact pad A7 are A1, A3, A11, and A9, as they comprise the group of second nearest contact pads. Here, the second order contact pads in FIG. 2G measure the strains in the 45 degree and 135 degree directions. With proper calculations, strain in one direction can be inferred by strain in other directions. For example, the strain between A7-A3 can be inferred by strain between A7-A2 and A7-A6. This technique can be used to not only infer strain for directions in which no strain gauge is positioned, but it also allows for the testing and verification of the strain gauges. In the example above, for instance, it may be determined that strain gauge A7-A3 is malfunctioning because it measures a signal that deviates too greatly from the inferred measurement of A7-A2 based on A7-A2 and A7-A6. Thus, the measure of the strain between the first order and second order pads can be used to eliminate defective contact pairs.

Figure 2D:
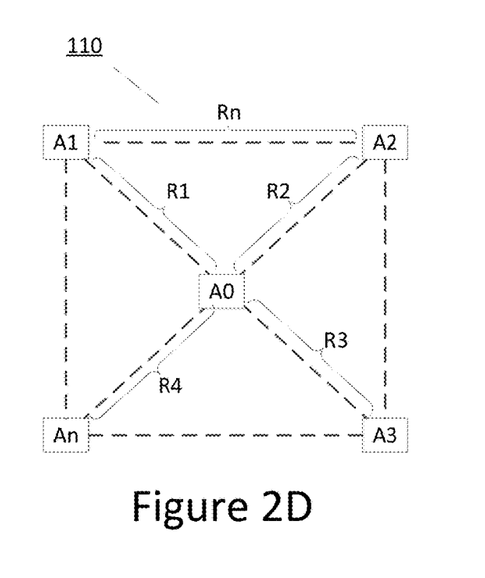
Figure 2E:
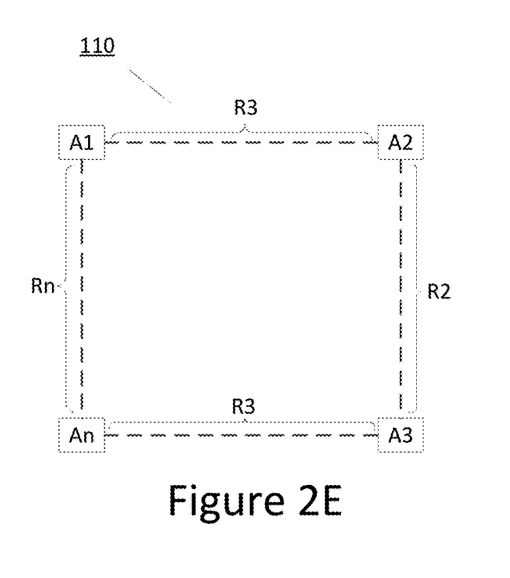
Figure 2F:
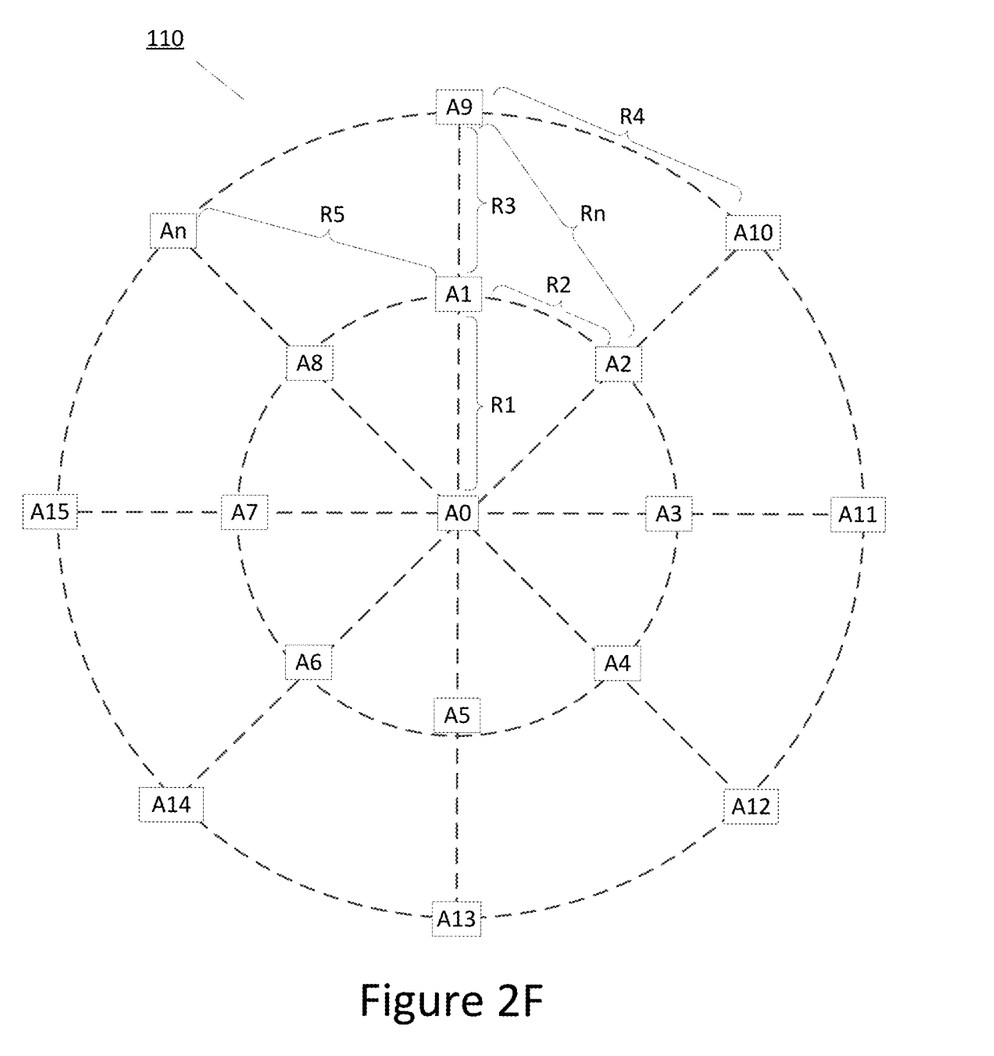
Figure 2G:
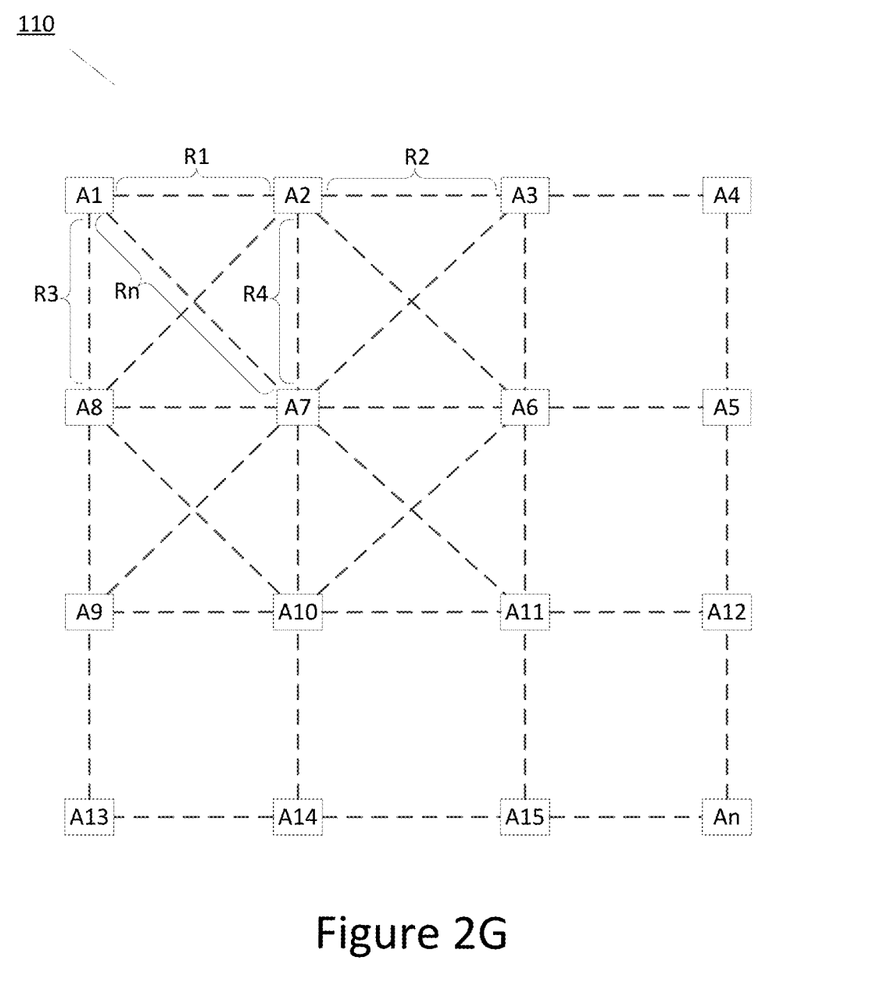
Figure 2H:
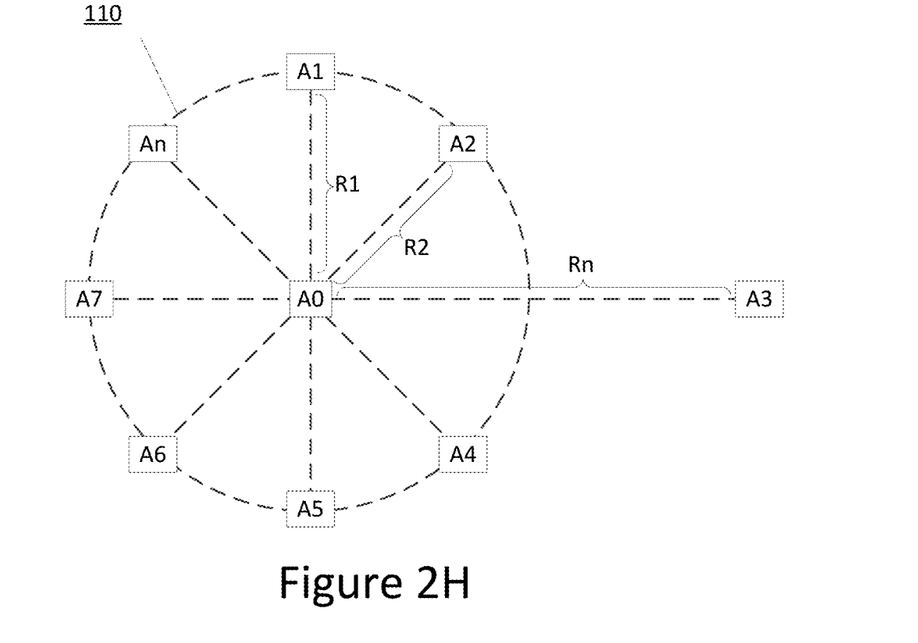
Figure 2I:
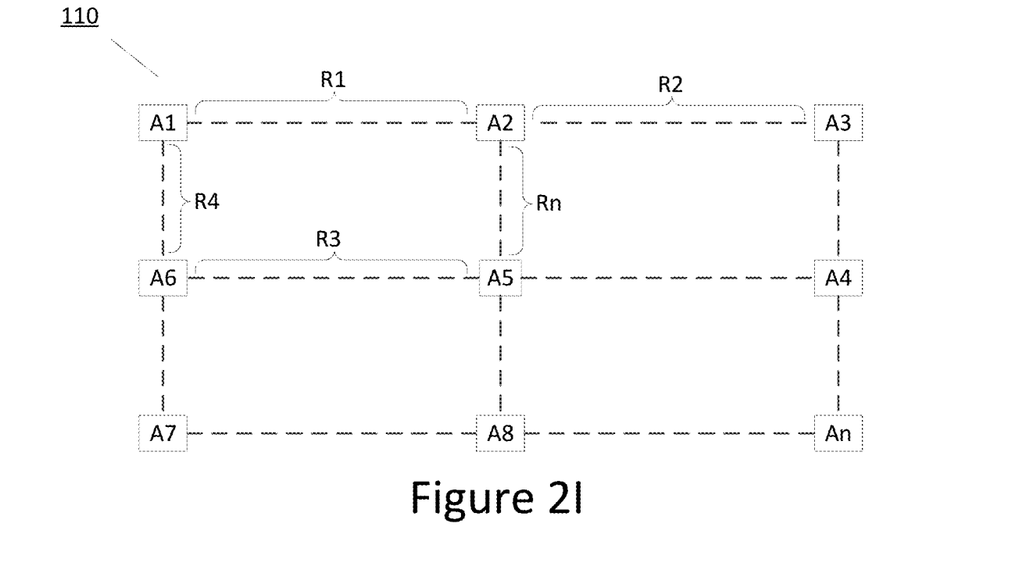
Figure 2J:
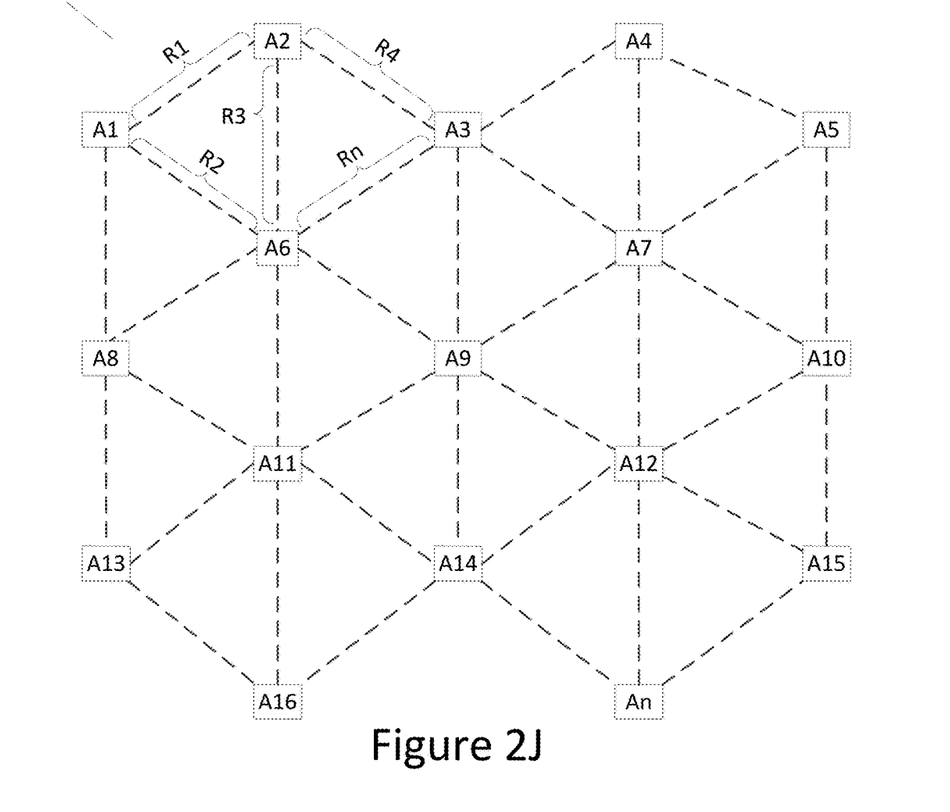
Figure 2K:
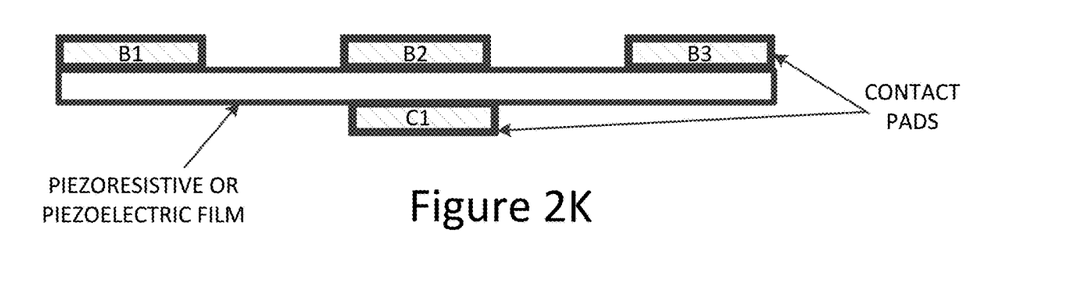
FIGS. 2K and 2L depict cross section views of strain gauge pattern 110.
Figure 2L:
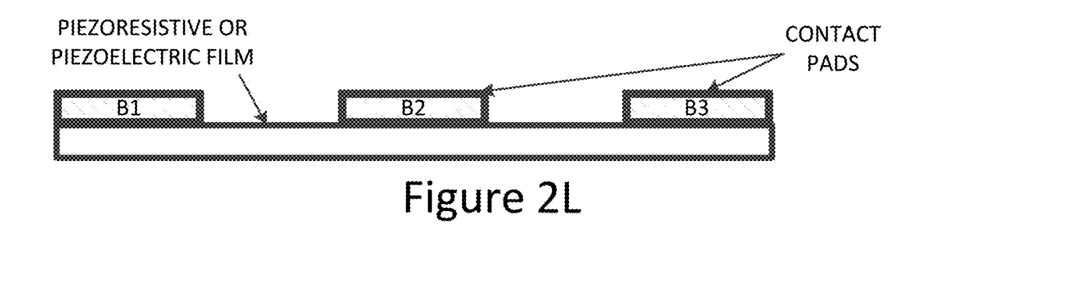

In addition to sensing strain between a single contact pad pair, strain gauge pattern 110 is further capable of sensing strain between multiple contact pad pairs simultaneously, allowing microcontroller 160 to employ algorithms that combine and manipulate simultaneous strain measurements. Moreover, with additional contact pads and probing configurations, microcontroller 160 can employ additional algorithmic manipulations which further increase the applicability and accuracy of the measurements taken by strain gauge pattern 110. To that point, microcontroller 160 may be configured to detect strain with more sensitivity and/or in additional directions by analyzing measurements across contact pad pairs situated in close proximity. For example and with continued reference to FIG. 2C, microcontroller 160 may be configured to analyze the measurements for a group of contact pads in a triangular configuration, such as contact pads A0-A1 (R1), A1-A2 (R4), and A0-A2 (R2). Alternatively, microcontroller 160 may be configured to analyze the strain of a group of strain gauges in a square orientation, as depicted by FIGS. 2D-2E with R1-Rn. In addition, microcontroller 160 may utilize a combination of capacitance sensors to map third direction strain change, or strain perpendicular to the pair of contact pads. In general, microcontroller 160 may be configured to simultaneously read measurements between any pair of contact pads and, moreover, analyze such measurements in parallel to deduce strain in a variety of directions. The algorithms used by microcontroller 160 in order to deduce strain amongst two or more contact pad pairs may be pre-programmed or, alternatively, microcontroller 160 may learn algorithms for deducing strain on the fly. Moreover, by not reading or omitting the analyses of a measurement between particular contact pads, measurements in particular directions can be avoided in the interest of conserving battery power, increasing efficiency, etc. Alternatively, microcontroller 160 may analyze the measurements of all contact pad pairs comprising strain gauge pattern 110 and deduce strain in a multitude of directions.

FIGS. 2A-2J depict alternative configurations of strain gauge pattern 110. It will be appreciated that in all configurations in which the contact pad distance within a pair differs from that of other pairs within the configuration, methods described above for modifying doping condition (e.g. patterns, concentration of dopant, etc) to change electrical properties in the case of a semiconductor piezo resistive type strain gauge, take measurements, and selecting alternative strain gauges may be employed to equalize resistance/potential between a contact pad pair at rest. In addition, it will be further appreciated that in all configurations, piezoresistive or piezoelectric strain gauges may be implemented. As illustrated by FIGS. 2A-2J, strain gauge pattern 110 may be configured in alternative orientations to sense strain on objects of different shapes and sizes. Accordingly, strain gauge pattern 110 may be configured in orientations other than those depicted by FIGS. 2A-2J and it will be appreciated by one skilled in the art that the present invention may be implemented in a variety of configurations. Moreover, while strain gauge pattern 110 is depicted as being comprised entirely of strain gauge material, in some embodiments, strain gauge pattern 110 may be formed on a substrate comprising other materials on which the strain gauge described herein is formed.

FIGS. 2K and 2L depict cross section views of strain gauge pattern 110. As depicted by FIG. 2K, contact pads can be deposited on either or both sides of the layer of strain gauge material. For example and with reference to FIG. 2K, contact pads B1-B3 may be positioned on a top of the strain gauge material while contact pad C1 may be positioned on the bottom of the strain gauge material. In some embodiments, this orientation may be desirable for increasing data and accuracy, or in embodiments where real estate on a side of strain gauge pattern 110 is minimal. For some material, such as piezoelectric material, it is preferable to have at least one contact pad on the other side of the sensing material. Yet in another embodiment, the contact pads can be on or in between a stack of the strain sensing material. Together with the in plane contact pads, it forms a three dimensional pattern of the contact pad, so that three dimensional strain can be measured. Alternatively, and illustrated by FIG. 2L, contact pads B1-B3 may be positioned only on a top of the strain gauge material.

Returning now to FIG. 1, the remaining components of strain gauge device 100 will be discussed in greater detail. Strain gauge device 100 further includes mux 120. In the example embodiment, mux 120 is a multiplexer capable of selecting a strain gauge between a pair of contact pads of strain gauge pattern 110 and transmitting the signals to measuring circuit 130. For example and with additional reference to FIG. 2A, mux 120 selects a strain gauge corresponding to contact pads A0-A1 for measuring circuit 130 to measure R1. Incorporating mux 120 into strain gauge device 100 is advantageous because it allows for a single measuring circuit 130, amp 140, ADC 150, and microcontroller 160 to read the measurements taken from any and all strain gauges of strain gauge pattern 110. While FIG. 1 illustrates mux 120 as a separate component from microcontroller 160, in other embodiments, microcontroller 160 may comprise an integrated mux 120. In such embodiments, microcontroller 160 performs the operations of mux 120 described herein.

Measuring circuit 130 is a hardware device that is capable of comparing and measuring resistances. With regard to the example embodiment depicted by FIG. 1A wherein strain gauge pattern 110 comprises piezoresistive type semiconductor strain gauges, measuring circuit 130 is a Wheatstone bridge, four-point Kelvin probe, or impedance measurement circuit. A Wheatstone bridge is an electrical circuit used to measure an unknown electrical resistance by balancing two legs of a bridge circuit, one leg of which includes the unknown component. In FIG. 1A where measuring circuit 130 is a Wheatstone bridge, measuring circuit 130A-C includes a resistor (measuring circuit 130A), an adjustable resistor (measuring circuit 130B), and another resistor (measuring circuit 130C), wherein the resistance of measuring circuit 130A is equal to that of measuring circuit 130C. The value of the adjustable resistor can be changed depending on the value of the resistance of a selected strain gauge (e.g. R1). The primary benefit of measuring circuit 130 is its ability to provide extremely accurate measurements when coupled with other components, such as amp 140, ADC 150, and microcontroller 160. For example and with additional reference to FIG. 2A, measuring circuit 130 measures a change in resistance R1 sensed between contact pads A0-A1.

With continued reference to measuring circuit 130, this time as it relates to FIG. 1B and piezoelectric type strain gauges, measuring circuit 130 includes measuring device 130A-130B as well as Vmeasure (Vm) and Vout (Vo). In embodiments implementing piezoelectric semiconductors, Vm is measured according to the Vo multiplied by the quotient of the sum of measuring device 130A-B divided by the resistance of measuring device 130B.

While FIGS. 1A-1B illustrate measuring circuit 130 as a separate component from microcontroller 160, in other embodiments, microcontroller 160 may comprise an integrated measuring circuit 130. In such embodiments, microcontroller 160 performs the operations of measuring circuit 130 described herein.

Amplifier (amp) 140 is a device used for increasing the power of a signal by increasing signal amplitude. In the example embodiment, amp 140 amplifies the analog signal corresponding to the measured strain that is measured by measuring circuit 130 before input into ADC 150. While FIG. 1 illustrates amp 140 as a separate component from microcontroller 160, in other embodiments, microcontroller 160 may comprise an integrated amp 140. In such embodiments, microcontroller 160 performs the operations of amp 140 described herein.

Analog to digital converter (ADC) 150 is a device that converts analog signals into digital signals. In the example embodiment, ADC 150 receives amplified analog signals from amp 140 and converts the analog signals into digital signals for input into microcontroller 160. While FIG. 1 illustrates ADC 150 as a separate component from microcontroller 160, in other embodiments, microcontroller 160 may comprise an integrated ADC 150. In such embodiments, microcontroller 160 performs the operations of ADC 150 described herein.

Microcontroller 160 is a computer used for processing digital signals received from ADC 150. In the example embodiment, microcontroller 160 includes a processor and storage (e.g. SRAM, flash memory, RAM, ROM, etc.), however in other embodiments may comprises more or less components as needed. Microcontroller 160 is programmed to processes the amplified digital signals received from ADC 150 using code, algorithms, etc. in order to deduce a strain sensed by the various strain gauges of strain gauge pattern 110 based on an orientation of the strain gauges and change in resistance/potential. In order to distinguish signals received from different strain gauges, microcontroller 160, or optionally mux 120, further includes a strain gauge lookup table defining a mapping of the locations and types of all of strain gauge pattern 110 such that microcontroller 160 knows which measurement corresponds to which contact pads. The lookup table may further include information dictating which strain gauges need be referenced in order to deduce strain in particular directions. Microcontroller 160 may have a further capability to change the mapping (lookup) table to disable a set of strain gauge when they are broken or operating abnormally.

In the example embodiment, a calibration procedure is needed to generate the strain gauge mapping (look up) table for each strain gauge. The calibration can be done either at the unstressed state (rest) or at a stressed state at time zero, such as mounted onto a subject in stationary state. The microprocessor will decide the strain gauge configuration needed for the application and scan through the contact pad configuration to take the initial measurements and store them in the lookup or mapping table. The table is used for calculating the strain change during the sensor operation to infer the motion of the subject. Operation of strain gauge pattern 110 by microcontroller 160 is described in greater detail with respect to FIG. 4.

Wireless adapter 170 is a device used for wireless communication with other electronic devices (e.g. smart phone, tablet, watch, PC, etc.). In the example embodiment, wireless adapter 170 communicates via wireless channels such as Wi-Fi, Bluetooth, near field communication (NFC), and other wireless communication protocols. In some embodiments, wireless adapter 170 may further include an integrated or separate antenna for increasing transmission signal range and/or power. While FIG. 1 illustrates wireless adapter 170 as a separate component from microcontroller 160, in other embodiments, microcontroller 160 may comprise an integrated wireless adapter 170 and/or antenna and radio-frequency-matching network. In such embodiments, microcontroller 160 performs the operations of wireless adapter 170 described herein.

Battery 180 is a device that provides energy to strain gauge device 100. In the example embodiment, battery 180 is a rechargeable battery that provides strain gauge device 100 electricity. In other embodiments, strain gauge device 100 is powered wirelessly by an external device using near field communication (NFC). In further embodiments, battery 180 may include other components for energy generation or battery 180 recharging, such as a small solar panel for converting light into electricity, an alternator for converting kinetic energy into electricity, a heat transfer device for converting heat into electricity, or other power generation methods. Alternatively, battery 180 may simply be plugged in or placed in contact with a charging device as needed. In yet further embodiments, battery 180 be a non-rechargeable battery that is replaced periodically, or other power supplying device, such a rechargeable battery, capacitor and/or super-capacitor. While in the example embodiment battery 180 is connectively coupled to microcontroller 160, in other embodiments, battery 180 may be connectively coupled to more or less components of wearable stain gauge device 100 as needed.

Figure 3A:
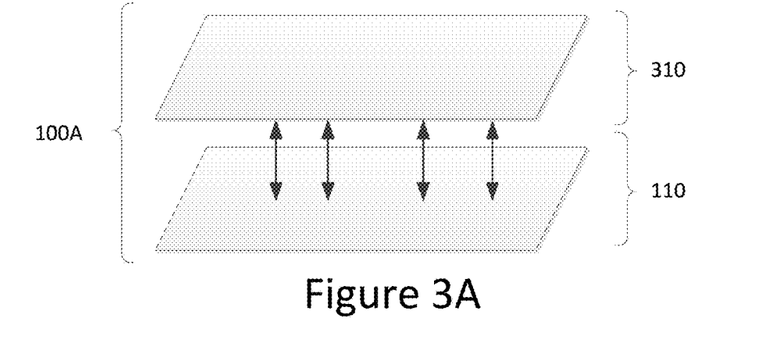
FIGS. 3A-3C depict various configurations of one or more layers of strain gauge device 100, in accordance with an embodiment of the present invention.
Figure 3B:
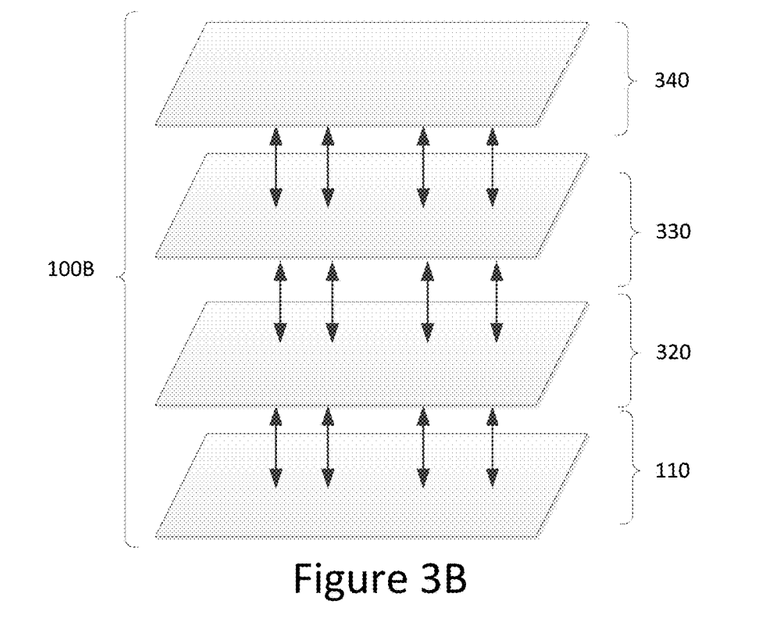
Figure 3C:
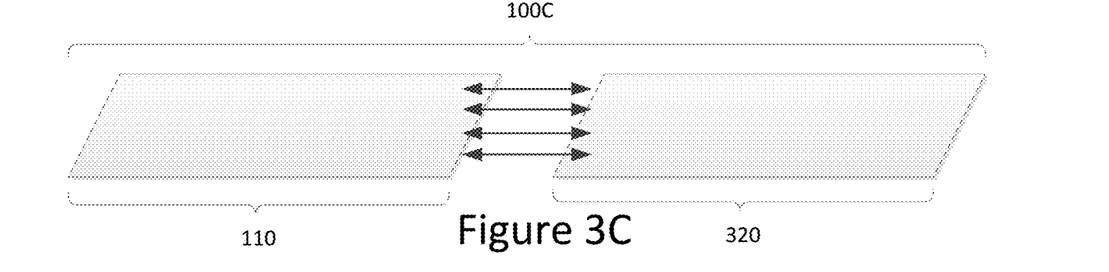

FIGS. 3A-3C depict alternative configurations of strain gauge device 100. Such configurations may be leveraged in order to minimize a thickness or footprint of strain gauge device 100 as needed. As depicted by strain gauge device 100A of FIG. 3A, strain gauge device 100A comprises strain gauge pattern 110 and layer 310. Strain gauge pattern 110 comprises strain gauges and contact pads A0-An as described and depicted by FIGS. 2A-2H while layer 310 comprises mux 120, measuring device 130, amp 140, ADC 150, microcontroller 160, wireless adapter 170, and battery 180 of FIG. 1, all layered on top of strain gauge pattern 110. In an alternative embodiment depicted by FIG. 3B, strain gauge device 100B is configured having additional layers, each layer comprising one or more components described herein of strain gauge device 100. In one example, strain gauge pattern 110 similarly includes strain gauges and contact pads while layer 320 may include mux 120 and measuring device 130. In this example, layer 330 may include amp 140, ADC 150, and microcontroller 160 while layer 340 may include wireless adapter 170 and battery 180. In another example, layer 320 may include mux 120, measuring device 130, amp 140, and ADC 150 while layer 330 includes microcontroller 160 and layer 340 includes wireless adapter 170 and battery 180. In an alternative embodiment depicted by FIG. 3C, strain gauge device 100C is fabricated or packaged in one layer, which consists of strain gauge pattern 110 and an electronics area for all other components on layer 320. Moreover, each layer may be composed of a flexible substrate. In general, strain gauge device 100 may be configured in any way such that all components described herein are implemented, however preferred embodiments isolate strain gauge pattern 110 from other layers to avoid adversely affecting strain gauge sensitivity and accuracy.

Figure 4:
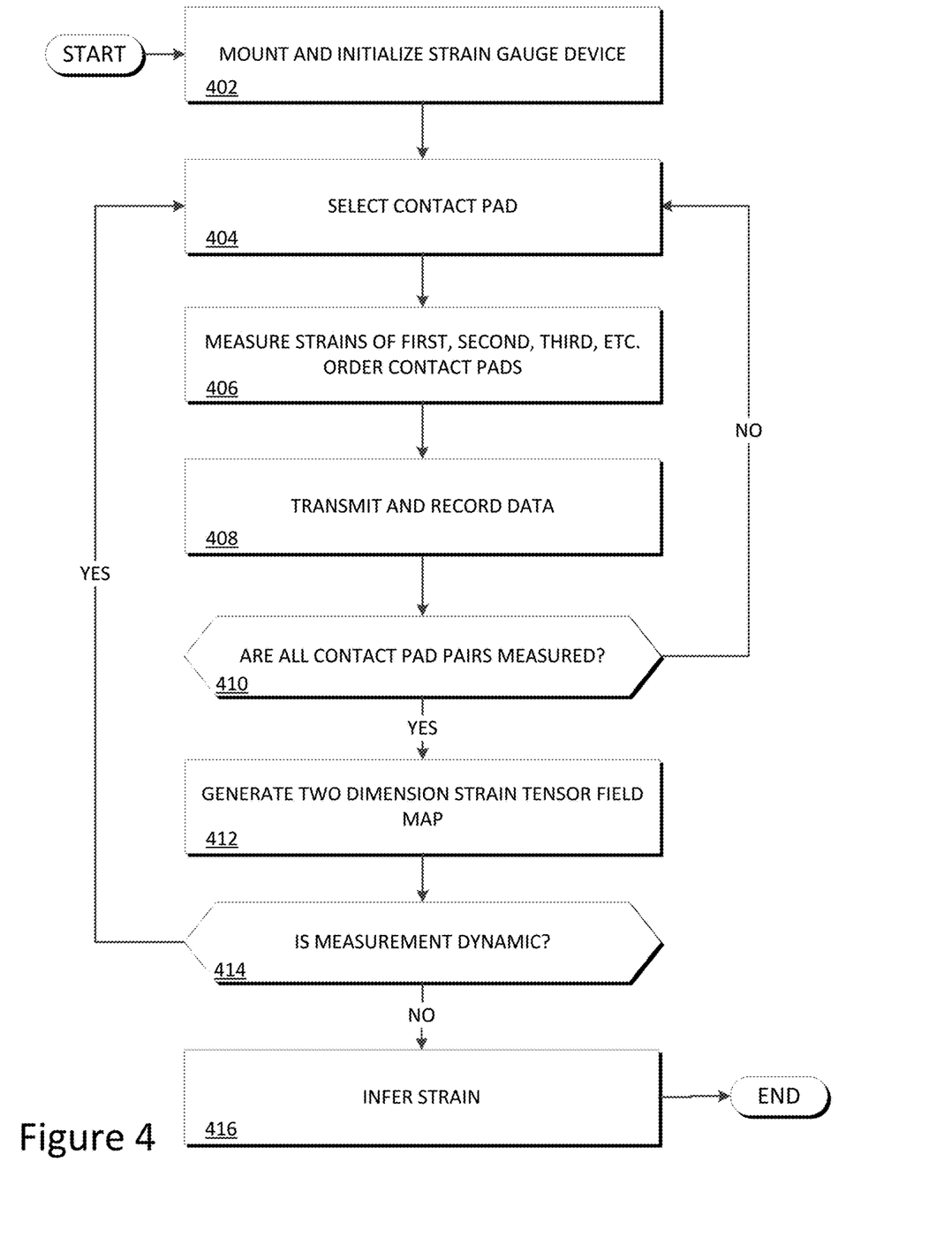
FIG. 4 depicts a flowchart illustrating the operations of strain gauge device 100, in accordance with an embodiment of the present invention.

FIG. 4 depicts the operations of strain gauge device 100, in accordance with an embodiment of the present invention. In the example embodiment, the flowchart depicted by FIG. 4 includes both configuration, such as placement and calibration of strain gauge device 100, as well as operation of strain gauge device 100. In general, microcontroller 160 of strain gauge device 100 is configured to map and store a baseline strain of strain gauge pattern 110 either at a strained or unstrained state, from which subsequent measurements are compared to infer a current strain.

Strain gauge device 100 is mounted to the surface of an object for which strain is to be measured and the device is initialized (step 402). In the example embodiment, strain gauge device 100 is mounted such that at least a layer comprising strain gauge pattern 110 makes direct contact with the surface of the object. For example, strain gauge device 100 may be applied to the skin, fingernail, or toenail of a human/animal in any configuration depicted by FIGS. 3A-3C. Moreover, strain gauge pattern 110 comprises contact pads which make contact with multiplexer and electronics in any arrangement depicted by, but not limited to FIGS. 2A-J. In the example embodiment, the initialization process comprises microcontroller 160 identifying and saving the coordinate locations of the contact pads of strain gauge pattern 110. By recording the location of each contact pad, microcontroller 160 is capable of determining a direction associated with a corresponding strain, as well as consolidate strain measurements from different directions to infer strain in others.

Microcontroller 160 selects a contact pad of strain gauge pattern 110 to begin measurements (step 404). In the example embodiment, microcontroller 160 performs calibration of strain gauge pattern 110 by controlling mux 120 to scan through first order contact pads which, as described above, are the nearest contact pads to the selected contact pad. As microcontroller 160 scans through each contact pad pair, microcontroller 160 measures a signal associated with the pair. Moreover, this process is completed at either stressed or unstressed states such that a measured strain of each contact pad pair is under similar conditions. This process establishes a baseline strain that subsequent measurements will be compared against in order to deduce a current strain change on the device. In another embodiment, microcontroller 160 may be programed to scan through second and higher orders of contact pads, in addition to the first order contact pads, and similarly measure signals from each pair. In the example embodiment, the operations are performed at initialization, however in some embodiments may be performed at other times to ensure proper calibration or in response to modification of strain gauge device 100.

Microcontroller 160 controls the memory module and wireless adapter 170 to transmit and record the data if necessary (step 408). In the example embodiment, microcontroller 160 is programmed to store measurements corresponding to the strain gauges during calibration, performed above, as well as subsequent measurements taken under strain. In other embodiments, only certain measurements may be stored by microcontroller 160, such as those exceeding a threshold or happening at particular times of day. Such measurements may be stored locally for temporary or permanent durations. For example, data may be stored on strain gauge device 100 temporarily until prescribed intervals or connections to networks are detected, at which point the data is transmitted. In another embodiment, the data may be stored until prompted by a user or strain gauge device 100 is physically removed from the object, at which point the data is extracted from storage. In yet further embodiments, data may be transferred in real time as measurements are taken and analyzed such that local storage of strain gauge device 100 may be dedicated to the mapping table and any other data needed for operation. In general, strain gauge device 100 may be configured to store or transmit data at any interval as desired. Moreover, data may be transmitted when it is determined that microcontroller 160 is not capable of processing the measured data. For example, some strain calculates may require more demanding computations than microcontroller 160 can perform and, in such cases, microcontroller 160 utilizes wireless adapter 170 to transmit the measured signals to a more computationally robust computer.

Microcontroller then determines whether all the contact pad pairs are measured (decision 410). Microcontroller 160 determines whether all contact pad pairs have been measured because the two dimensional array described by the example embodiment relies on not just one strain measurement, but a plurality of measurements in a variety of directions in order to generate a two-dimensional strain field. Thus, by measuring strain along different contact pad pairs along many different orders, strain can be deduced all along the two-dimensional plane.

If microcontroller 160 determines that not all contact pad pairs have been measured (decision 410 "NO" branch), then microcontroller 160 selects a next contact pad (step 404) and repeats the above steps.

If microcontroller 160 determines that all contact pad pairs have been measured (decision 410 "YES" branch), then microcontroller 160 calculates and generates a 2D strain field map with location coordinates associated with coordinates of contact pads (step 412). In the example embodiment, microcontroller 160 additionally stores the measured strain field such that subsequent measurements may be compared to the stored strain field in order to deduce strain change.

Microcontroller 160 then determines whether the measurement is dynamic (decision 414). In the example embodiment, dynamic measurements are measurements which are taken over time, as opposed to a one time measurement. Dynamic measurements may be programmed to be taken at reoccurring intervals or upon specific triggers such that a change in the strain field can be sensed as time progresses or actions are taken by a host of strain gauge device 100.

If microcontroller 160 determines that the measurement is dynamic (decision 414 "YES" branch), then microcontroller 160 repeats the process again from step 404 at a next time interval until completion of the measurement period. In such a process, microcontroller 160 may measure and store a signal from any of the configured contact pad pairs any number of times. The measurements of the strain field maps at different time intervals are compared to obtain the change in the strain field, and infer to the fine movement of the subject through an algorithm.

If microcontroller 160 determines that the measurement is not dynamic (decision 414 "NO" branch), then microcontroller 160 infers a strain (step 416). In the example embodiment, microcontroller 160 calculates a change in strain based on comparing the measured signal to the calibration. More specifically, microcontroller 160 determines change in strain field by determining a deviation of the measured resistance/potential at different states. If the strain field map is compared to the initial state, the difference between the current strain map and initial strain map, i.e. calibration, can be used to infer the absolute change of move movement from initial state. If the current strain field map is compared to the strain map of the previous state, the change in the strain field can be used to infer the relative movement of the subject from the previous state. Generally, a greater deviation of the measurements from the calibrations infer a greater strain, however calibrations are specific to strain gauges and may exhibit different characteristics. With the distributed, two-dimension pattern of contact pads on strain gauge device 100, a strain tensor field can be mapped with spatial coordinates, direction and magnitude. Therefore, two-dimensional movement with fine spatial resolution can be resolved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature. Numerous modifications and substitutions can be made without deviating from the scope of the present invention. Therefore, the present invention has been disclosed by way of example and not limitation.

What is claimed is:

1. A wearable structure for a strain gauge device, wherein the wearable structure is attached to a human body, the structure comprising:
   a layer of piezoelectric material and three or more contact pads positioned directly on the layer of piezoelectric material, wherein an initial resistance between each pair of contact pads from among the three or more contact pads is equal; and
   the layer of piezoelectric material and the three or more contact pads operatively connected to a multiplexer, a measuring device, an amplifier, an analog to digital converter, a microcontroller, and a wireless adapter.

2. The structure of claim 1, wherein the multiplexer selects two or more pairs of the three or more contact pads, the measuring device measures an analog signal corresponding to the layer of piezoelectric material between the two or more pairs of contact pads, the amplifier amplifies the analog signal, the analog to digital converter converts the amplified signal to a digital signal, the microcontroller processes the digital signal, and the wireless adapter transmits the processed digital signal.

3. The structure of claim 2, further comprising an energy source to provide energy to the structure.

4. The structure of claim 2, wherein a first pair of the two or more pairs of contact pads measure a first signal produced by the piezoelectric material in a first direction, and wherein a second pair of the two or more pairs of contact pads measure a second signal produced by the piezoelectric material in a second direction, thereby forming a two-dimensional strain field based on the measured signals and coordinates of the three or more contact pads.

5. The structure of claim 4, wherein a third signal in a third direction is inferred from the first signal in the first direction and the second signal in the second direction.

6. The structure of claim 5, wherein a malfunctioning contact pad is identified by comparing the inferred third signal in the third direction to a third signal measured by a contact pad in the third direction.

7. The structure of claim 2, wherein a change in the signal corresponding to the layer of piezoelectric material between the two or more pairs of contact pads is indicative of a change in strain corresponding to the layer of piezoelectric material between the two or more pairs of contact pads.

8. The structure of claim 1, wherein the three or more contact pads are positioned in a non-linear configuration.

9. A wearable structure for a strain gauge device, wherein the wearable structure is attached to a human body, the structure comprising:
   a layer of piezoresistive material and three or more contact pads positioned directly on the layer of piezoresistive material, wherein an initial resistance between each pair of contact pads from among the three or more contact pads is equal; and
   the layer of piezoresistive material and the three or more contact pads operatively connected to a multiplexer, a measuring device, an amplifier, an analog to digital converter, a microcontroller, and a wireless adapter.

10. The structure of claim 9, wherein the multiplexer selects two or more pairs of the three or more contact pads, the measuring device measures an analog signal corresponding to the layer of piezoresistive material between two or more pairs of contact pads, the amplifier amplifies the analog signal, the analog to digital converter converts the amplified signal to a digital signal, the microcontroller processes the digital signal, and the wireless adapter transmits the processed digital signal.

11. The structure of claim 10, further comprising an energy source to provide energy to the structure.

12. The structure of claim 10, wherein a first pair of the two or more pairs of contact pads measure a first signal produced by the piezoresistive material in a first direction, and wherein a second pair of the two or more pairs of contact pads measure a second signal produced by the piezoresistive material in a second direction, thereby forming a two-dimensional strain field based on the measured signals and coordinates of the three or more contact pads.

13. The structure of claim 12, wherein a third signal in a third direction is inferred from the first signal in the first direction and the second signal in the second direction.

14. The structure of claim 13, wherein a malfunctioning contact pad is identified by comparing the inferred third signal in the third direction to a third signal measured by a contact pad in the third direction.

15. The structure of claim 10, wherein a change in the signal corresponding to the layer of piezoresistive material between the one or more pairs of contact pads is indicative of a change in strain corresponding to the layer of piezoresistive material between the two or more pairs of contact pads.

16. The structure of claim 12, wherein the layer of piezoresistive material is doped such that the first signal is equal to the second signal when the layer of piezoresistive material is unstrained.

17. The structure of claim 9, wherein the three or more contact pads are positioned in a non-linear configuration.

18. The structure of claim 9, wherein the measuring device comprises at least one of a Wheatstone bridge and a four point Kevin probe.

* * * * *